United States Patent [19]

Bertoglio et al.

[11] Patent Number: 4,838,801
[45] Date of Patent: * Jun. 13, 1989

[54] LEADLESS COMPONENT SOCKET

[75] Inventors: Guido Bertoglio, Viganello, Switzerland; Michael C. Boyle, Norton; James S. Cooney, Attleboro, both of Mass.; William B. Walkup, Barrington, R.I.

[73] Assignee: Augat Inc., Mansfield, Mass.

[*] Notice: The portion of the term of this patent subsequent to Jan. 13, 2004 has been disclaimed.

[21] Appl. No.: 115,511

[22] Filed: Nov. 2, 1987

[51] Int. Cl.⁴ ............................................. H01R 9/09
[52] U.S. Cl. ..................................... 439/83; 439/482; 439/851; 439/66
[58] Field of Search ................. 439/66, 71, 76, 81, 439/83, 482, 591, 851, 852, 856

[56] References Cited

U.S. PATENT DOCUMENTS

| 4,083,623 | 4/1978 | Lynch | 439/83 |
| 4,636,026 | 1/1987 | Cooney et al. | 339/225 R |
| 4,645,278 | 2/1987 | Yevak, Jr. et al. | 439/83 |
| 4,686,465 | 8/1987 | Krüger | 439/482 |
| 4,716,365 | 12/1987 | Pool | 439/482 |
| 4,718,166 | 1/1988 | DeFilippis et al. | 439/851 |

Primary Examiner—Joseph H. McGlynn
Assistant Examiner—P. Austin Bradley
Attorney, Agent, or Firm—Weingarten, Schurgin, Gagnebin & Hayes

[57] ABSTRACT

A leadless component socket comprises a socket body of electrically insulative material and planar, substantially parallel, top and bottom surfaces, and a plurality of openings between the surfaces in an array to provide an intended contact pattern. A two-piece spring contact assembly is retained in respective openings, with one element retained within the opening and having an outwardly extending lead for soldering or other connection to a circuit board on which the socket is mounted, and the other element extending above the upper socket surface in a position to engage the confronting terminals of a leadless component or device, such as a leadless chip carrier.

10 Claims, 4 Drawing Sheets

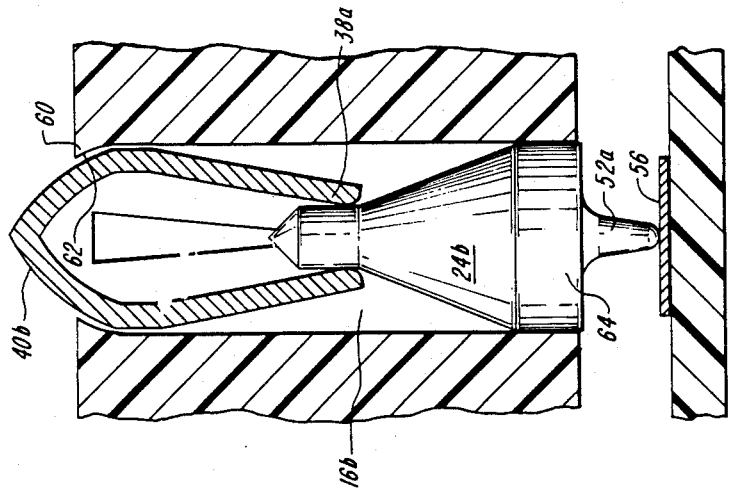
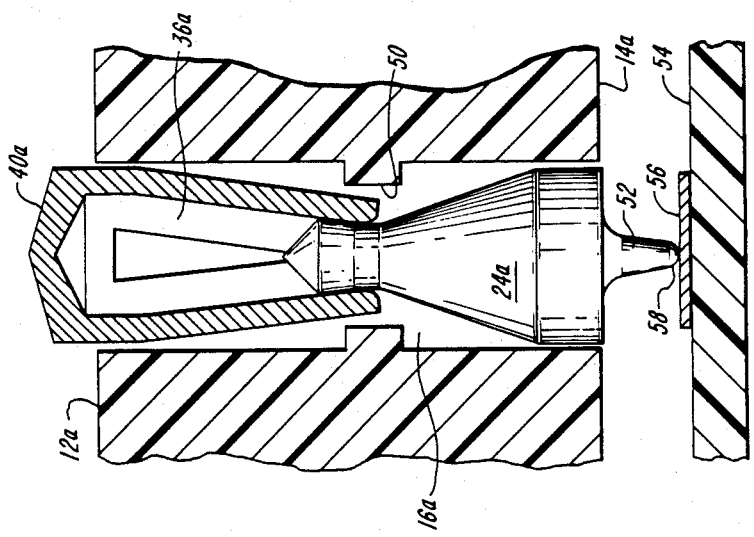
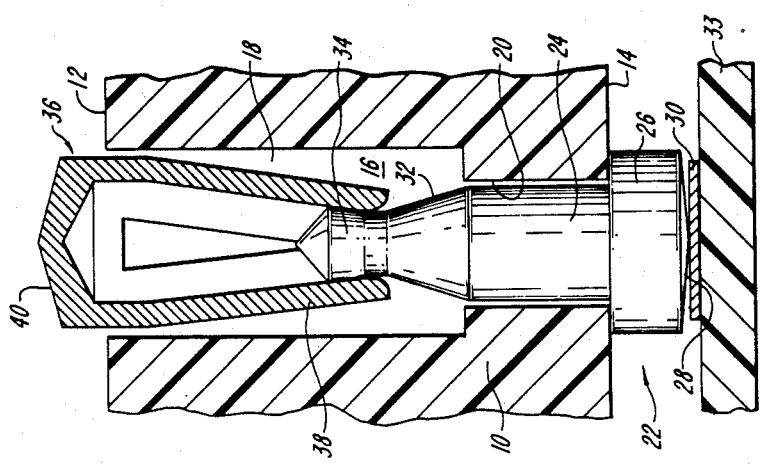

LEADLESS COMPONENT SOCKET

FIELD OF THE INVENTION

This invention relates to electronic sockets and, more particularly, to electronic component sockets for receiving leadless components.

BACKGROUND OF THE INVENTION

Electronic component sockets are known for retaining leadless components. Generally, such sockets include an array of resilient contacts in a predetermined pattern corresponding to the terminal pattern of the component or device to be mounted on the socket, and means for retaining the leadless component in position with the component terminals mated with the socket contacts.

A novel test probe is the subject of U.S. Pat. No. 4,636,026 and which provides a simple and efficient two-piece, spring-loaded contact. It is an object of this invention to provide a leadless component carrier of improved construction and operation utilizing spring contacts of the type shown in U.S. Pat. No. 4,636,026.

SUMMARY OF THE INVENTION

The leadless component socket in accordance with the invention comprises a socket body of electrically insulative material and having planar, substantially parallel top and bottom surfaces, and a plurality of openings between the surfaces in an array to provide an intended contact pattern. A two-piece spring contact assembly is retained in respective openings, with one element retained within the opening and having an outwardly extending lead for soldering or other connection to a circuit board on which the socket is mounted, and the other element extending above the upper socket surface in a position to engage the confronting terminals of a leadless component or device, such as a leadless chip carrier.

In one embodiment, the two-piece spring contact is loosely retained within its mounting opening by cooperative means within the socket opening, such that, when the socket is mounted to a circuit board, the contact assembly can be pressed downward into engagement with the underlying circuit board and the spring contact lead then soldered into place. This mounting technique accommodates for uneven surface alignment or lack of coplanarity between the socket and circuit board surfaces. In another embodiment, one spring contact element is retained in the socket opening by interference fit. The spring contacts can be preloaded within the socket openings to provide more uniform loading across the contact array.

DESCRIPTION OF THE DRAWINGS

The invention will be more fully understood from the following detailed description taken in conjunction with the accompanying drawings in which:

FIG. 1 is a cutaway elevation view of one embodiment of the invention;

FIG. 2 is a cutaway elevation view of a second embodiment of the invention;

FIG. 3 is a sectional elevation view of a further embodiment of the invention;

DETAILED DESCRIPTION OF THE INVENTION

Figure 5:
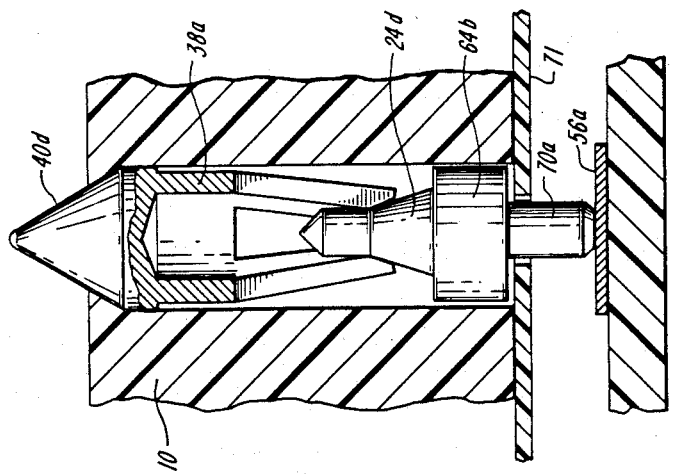
FIG. 5 is a sectional elevation view of another embodiment of the invention.

Referring to FIG. 1, there is shown in cutaway elevation view a portion of a leadless component socket constructed and operative in accordance with the invention. The socket body 10 is of plate-like configuration, having flat top and bottom surfaces 12 and 14, respectively, and an array of openings 16 in a pattern providing the intended contact pattern to accommodate a matable, leadless component or device, such as a leadless chip carrier. One opening is shown in FIG. 1 and is of stepped configuration, having a larger diameter portion 18 terminating at the top surface 12 and a smaller diameter section 20 terminating at the bottom surface 14. The first element 22 of the spring contact assembly has a central section 24 of diameter to fit within opening 20, an enlarged portion 26 of diameter larger than the diameter of section 20 and disposed in engagement with the bottom surface 14. The outer end of portion 26 is of conical configuration 28 for mating with a contact pad 30 of a circuit board 33 or other mounting surface. The inner end of element 22 includes an inwardly tapering, conical surface 32, which joins an outwardly tapering end section 34.

The second element 36 of the spring contact assembly includes a plurality of spring fingers 38 which inwardly taper, as illustrated, and which surround the end section 34 of element 22, and which are retained by the outward taper of that end section. The outer end of element 36 extends above top surface 12 and includes a conical surface 40, which provides a contact tip for engagement with a confronting terminal of the leadless device. Downward force on contact tip 40 causes the spring fingers 38 to ride along conical surface 32 and to produce an upwardly biased spring force for maintaining proper contact engagement between element 36 and the confronting device terminal.

An alternative embodiment is shown in FIG. 2. The element 24a is loosely captured on element 36a, and this assembly is loosely retained within the opening 16a of socket body 10a by retention ring 50 provided in opening 16a. The ring is of a diameter to prevent removal of the assembled spring contact from either the top or the bottom of the opening. The element 24a has a solder lead 52 extending outward from the bottom surface 14a of the socket body.

To mount the socket on a circuit board 54, the lead 52 is aligned with the contact pad 56 on the circuit board surface, and a downward force is applied to the contact tip 40a to press the lead 52 against the contact pad 56 during soldering of the lead. The solder joint 58 formed between the lead and contact pad retains the socket in place and provides electrical connection between the socket leads and underlying circuit board. Loading of the spring contacts during soldering of the socket accommodates for uneven surfaces or misalignment which may be present between the socket leads and mounting surface.

A further embodiment is shown in FIG. 3. Here the top end of the mounting opening 16b has a peripheral lip 60 with an inner surface 62 which conforms to and engages a confronting portion of the spring contact tip 40b. The element 24b includes a cylindrical portion 64 which is in interference fit with the opening 16b for retention of element 24b in the mounting opening. The spring contact is preloaded when assembled in the board by reason of the bias force caused by the spring fingers 38a engaging conical surface 32a. The preloading of the contact assembly maintains sealed top and bottom surfaces of the socket body, and also provides more uniform loading of the contact array by providing an initial minimum bias force on the array of spring contacts. A lead 52a outwardly extends from the bottom end, and functions like in the FIG. 2 version to contact pad 56.

Figure 4:
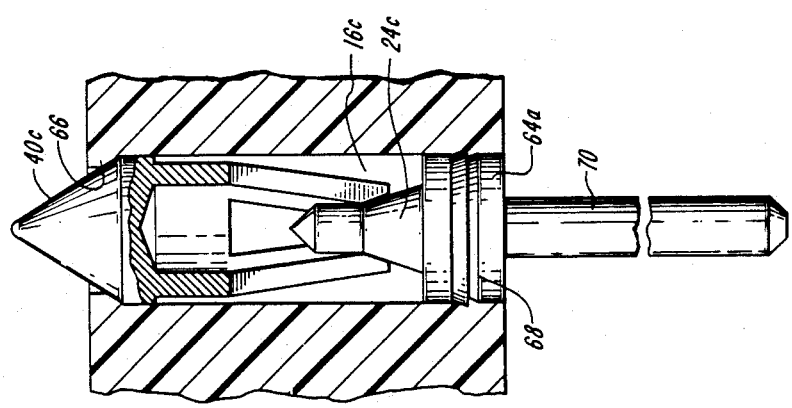
FIG. 4 is a sectional elevation view of an embodiment similar to that of FIG. 3.

A variation of this embodiment is shown in FIG. 4 wherein the contact tip 40c is of conical configuration, and having a surface portion conforming to and engageable with conical surface 66 of the socket body. The element 24c is retained in the opening 16c by cylindrical portion 64a which has a barbed ridge 68 to anchor the element 24c in place. A lead 70 extends from the socket, this lead being of a form to be inserted into an opening of a circuit board on which the socket is mounted.

A further embodiment is shown in FIG. 5. The element 38a is substantially as shown in FIG. 4. The element 64b is not locked into the mounting opening as in the FIG. 4 embodiment, but is slidably disposed in the mounting opening and retained therein by a flexible film 71 mounted to the bottom surface of the body 10. A lead post 70a extends through an opening in film 71 to engage a confronting contacting pad 56a. In use, a downward force on contact tip 40d causes the spring fingers to ride along conical surface 24d to produce a force on the contact pad 56a. In this embodiment the spring contact assembly is free-floating within its mounting opening in the absence of downward pressure on the contact tip. In the presence of such downward pressure the spring assembly is urged downward to provide pressure contact between the lead 70a and contact pad 56a, and between the contact tip 40d and the contact pad of an electronic component mounted on the assembly. This version allows for relative ease of alignment between the spring contact assembly and the underlying contact pads, since there is only loose engagement therebetween until pressure is applied to the contact tip during use.

The contact tips of the spring contact assembly can take a variety of forms to suit particular requirements. The leads of the contact assembly for mounting the socket to a mounting surface can also take a variety of forms to suit the intended mounting arrangement.

Figure 6:
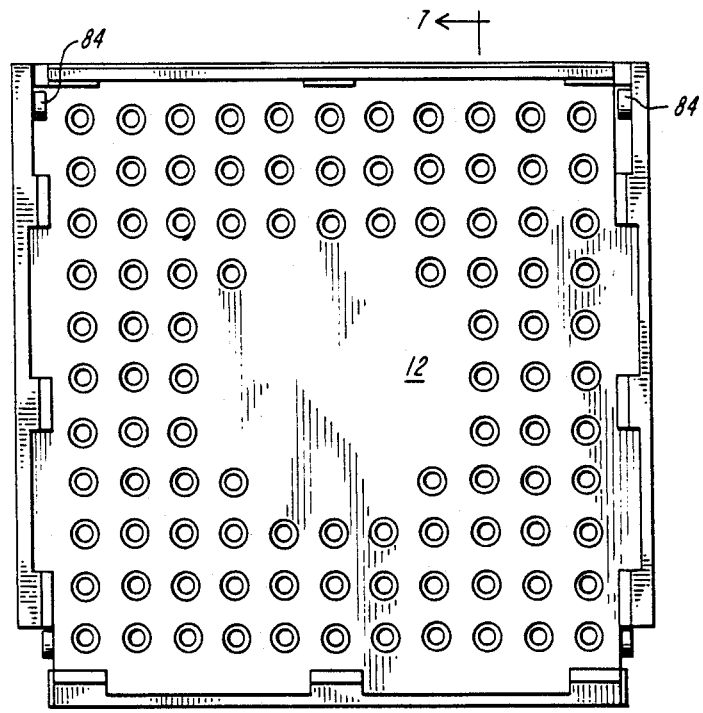
FIG. 6 is a plan view of a leadless device socket in which the invention can be embodied.
Figure 7:
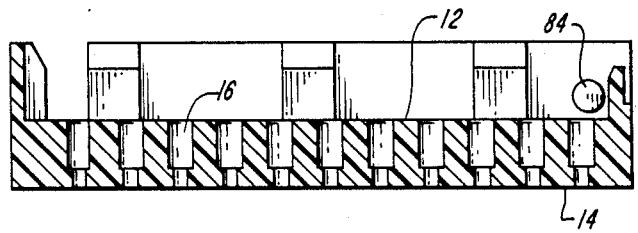
FIG. 7 is a sectional elevation view of the socket of FIG. 6.
Figure 8:
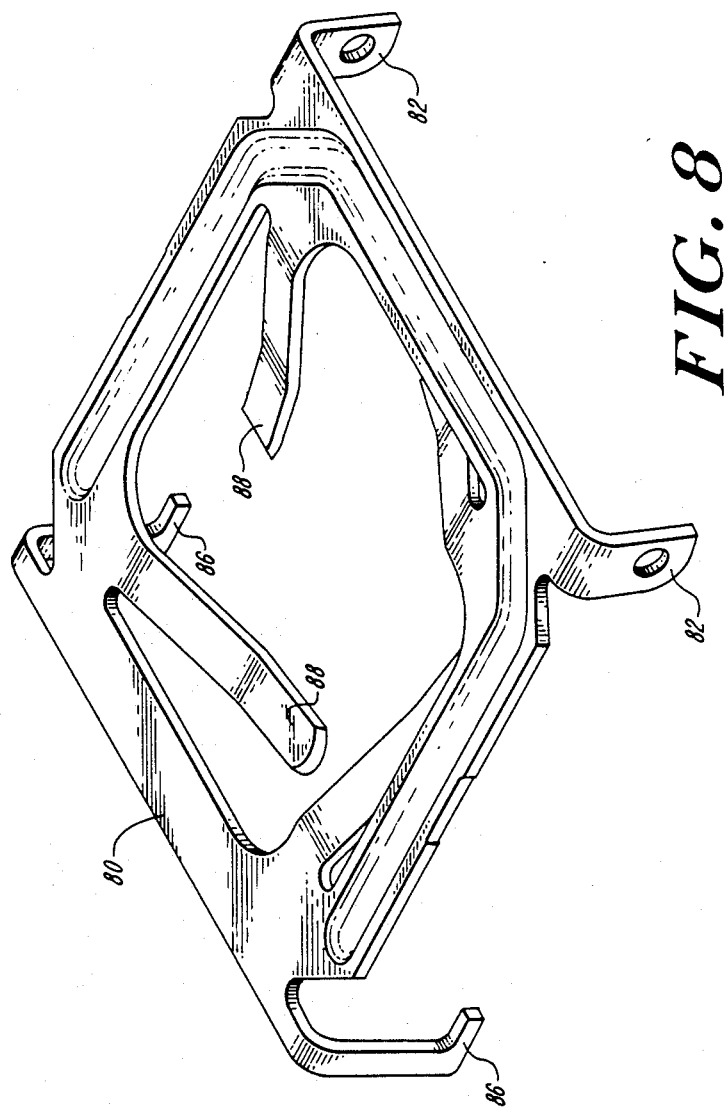
FIG. 8 is a perspective view of a cover used with the socket of FIGS. 6 and 7.

The leadless device socket is shown in its overall configuration in FIGS. 6 and 7. The spring contacts are arranged within respective openings 16 in an array conforming to the terminal pattern of a device retained on the socket. A cover 80, FIG. 8, is employed to retain the device in the socket and in engagement with the electrical contacts. The cover includes mounting tabs 82 which are pivotally attached to respective posts 84 of the socket body, latch ends 86 cooperative with the body for securing the cover in a closed position, and spring fingers 88 for biasing the component onto the contact tips of the spring assemblies.

The invention is not to be limited by what has been particularly shown and described, except as indicated in the appended claims.

In the claims:

1. A leadless component socket comprising:
   a socket body of electrically insulative material having a planar top surface and a substantially parallel planar bottom surface and a plurality of openings between the top and bottom surfaces in an array to provide an intended contact pattern;
   a plurality of spring contact assemblies each retained in a respective opening, each spring contact assembly including:
      a first element disposed within the opening adjacent the bottom surface of the socket body and having an outwardly extending lead for attachment to a contact element of a mounting member;
      a second element disposed within the opening adjacent the top surface of the socket body and having a contact tip outwardly extending from the top surface for engaging a contact of a leadless component mounted on the socket;
      one of the elements having a ramp surface;
      the other one of the elements having spring means cooperative with the ramp surface, the spring means being movable in a direction transverse to the axis of the first element and operative to bias the first element to a normally outward axial position.

2. The invention of claim 1 wherein the openings in the socket body are of stepped configuration having a larger diameter portion terminating at the top surface and a smaller diameter portion terminating at the bottom surface; the first element of the spring contact assembly having a central section fitted within the smaller diameter portion.

3. The invention of claim 1 wherein the first element of the spring contact assembly has an outwardly extending lead which includes a distal end of generally conical configuration for mating with the contact element of a mounting member.

4. The invention of claim 1 wherein each opening in the socket body includes a peripheral lip at the top surface operative to engage the second element of the spring contact assembly for retention of the second element in the opening in the socket body;
   a flexible film provided on the bottom surface and having an opening aligned with opening in the socket body;
   the outwardly extending lead of the first element of the spring contact assembly extending through the opening in the flexible film for engagement with a contact element of a mounting member.

5. The invention of claim 1 including means for retaining the spring contact assemblies in the respective openings of the socket body.

6. The invention of claim 1 including cover means attached to the socket body and operative to maintain a component on the socket body in engagement with the contact tips of the spring contact assemblies.

7. The invention of claim 1 wherein the socket body includes a plurality of openings each having retention means therein;
   each of the spring contact assemblies being loosely retained within respective openings by said retaining means.

8. The invention of claim 1 wherein the retaining means includes for each of said openings a retention ring within the opening disposed intermediate the top and bottom surfaces and sized to prevent removal of the assembled spring contact assembly from the top and bottom of the opening.

9. The invention of claim 1 wherein each opening in the socket body includes a peripheral lip operative to engage a confronting portion of the spring contact tip of the second element of the spring contact assembly for retention of the element in the opening in the socket body.

10. The invention of claim 9 wherein the first element is secured within the opening in the socket body and operative to provide a preloading force on the second element.

* * * * *